(12) United States Patent
Heid

(10) Patent No.: US 6,342,785 B1
(45) Date of Patent: Jan. 29, 2002

(54) METHOD FOR QUANTIFICATION AND REPRESENTATION OF IN VIVO FLUID FLOW USING MAGNETIC RESONANCE

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/365,902

(22) Filed: Aug. 3, 1999

(30) Foreign Application Priority Data

Aug. 12, 1998 (DE) .......................................... 198 36 592

(51) Int. Cl.$^7$ ................................................. G01V 3/00
(52) U.S. Cl. ....................................................... 324/309
(58) Field of Search ......................................... 324/309

(56) References Cited

U.S. PATENT DOCUMENTS

| | | | | |
|---|---|---|---|---|
| 4,205,687 A | * | 6/1980 | White et al. | 73/194 |
| 4,516,582 A | * | 5/1985 | Redington | 324/309 |
| 4,609,872 A | * | 9/1986 | O'Donnell | 324/306 |
| 4,991,586 A | | 2/1991 | Mueller et al. | |
| 5,144,242 A | | 9/1992 | Zeilenga et al. | |
| 5,606,258 A | | 2/1997 | Hoenninger, III et al. | |

\* cited by examiner

*Primary Examiner*—Jay Patidar
*Assistant Examiner*—Dixomara Vargas
(74) *Attorney, Agent, or Firm*—Schiff Hardin & Waite

(57) ABSTRACT

In a method for flow quantification by nuclear magnetic resonance signals that are phase-encoded corresponding to their flow rate are evaluated in real time and the rate dependent phase is converted into graphic information. The parameters of the measuring process are interactively adjustable during the measuring process.

8 Claims, 2 Drawing Sheets

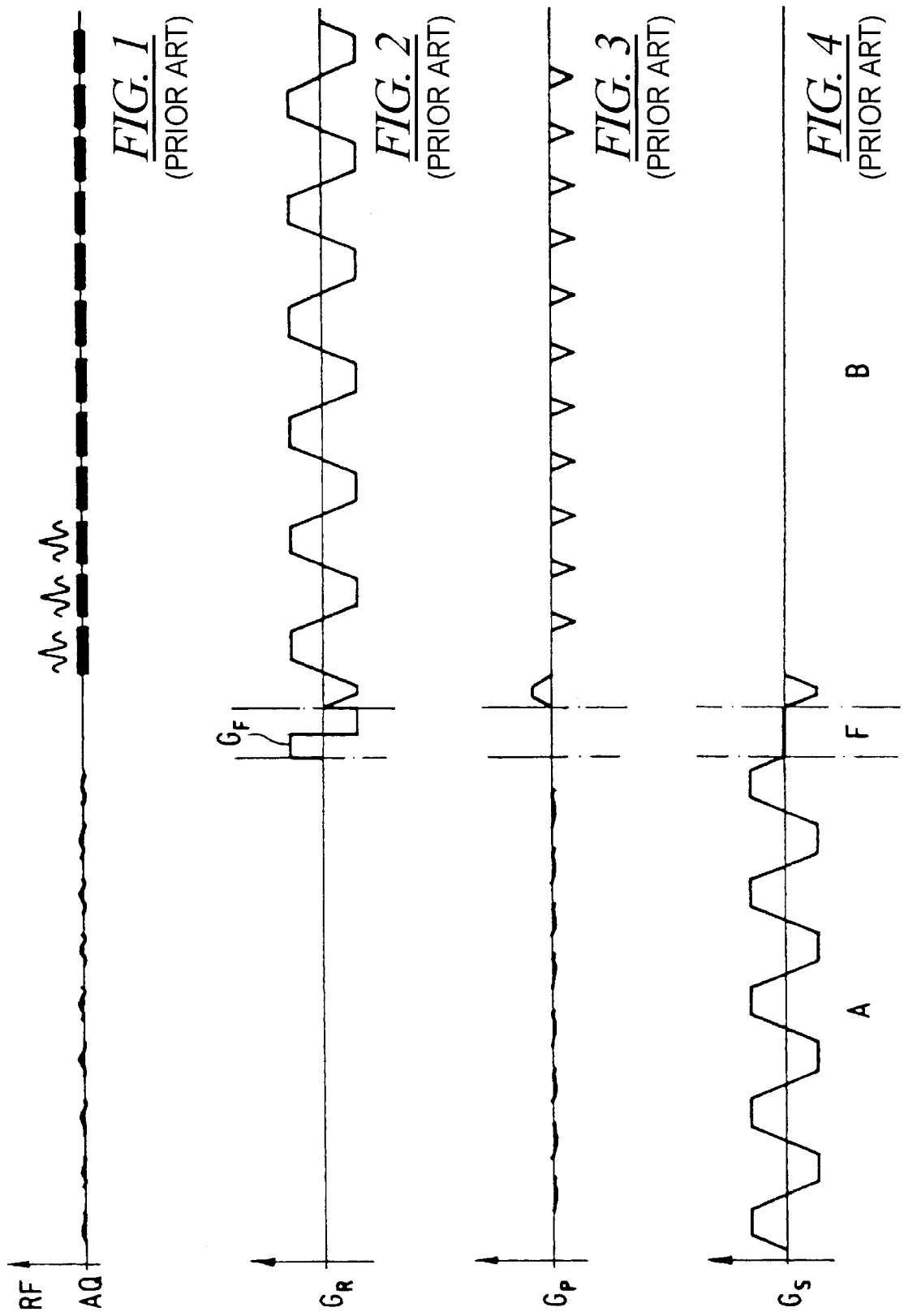

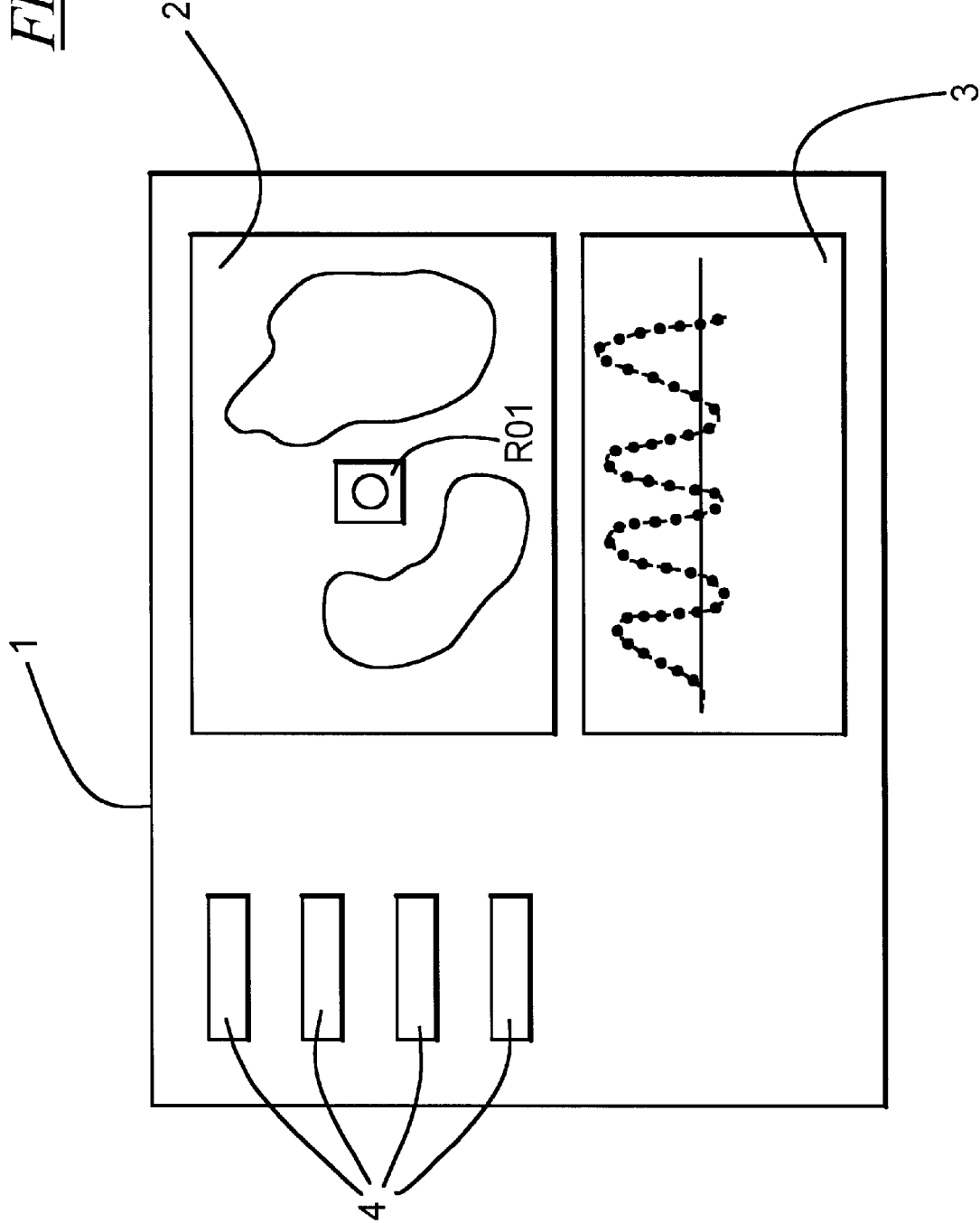

METHOD FOR QUANTIFICATION AND REPRESENTATION OF IN VIVO FLUID FLOW USING MAGNETIC RESONANCE

BACKGROUND OF THE INVENTION

1. Field of the Invention

The present invention is directed to a method for quantification and representation of in vivo fluid flow using data obtained in a magnetic resonance measurement sequence.

2. Description of the Prior Art

Using the phase contrast angiography, which is described in detail in the European Patent Specification 0 115 642, it is possible to quantitatively detect the flow in vessels with MR systems. The MR system has to meet high requirements in order to measure a sufficient spatial and time resolution of the flow in real time. When one wants to exactly measure the peak value, for example, of the systolic arterial blood flow in the human body, a time resolution under 40 ms is required. Additionally, the spacial resolution should at least be four times as large as the relevant vessel, which means so that one arrives at a required spatial, resolution of 2 mm for renal arteries, for example. A specific flow encoding with a changing flow encoding direction was suggested in the SMRM Abstracts Sydney 1998, page 2144 in order to realize the high spatial resolution in conjunction with the high time resolution given the phase contrast angiography. In this context, the conventional flow re-phasing can be foregone. Using EPI sequences, 27 flow coded images per second can be acquired with a spatial resolution of 2 mm, i.e. the above mentioned requirements can be met.

This known method has the disadvantage that even though a rapid measurement, ensues the evaluation is not carded out in real time. Thus, it is not possible to alter parameters of the intervention during the image data acquisition.

European Patent Specification 0 355 508 discloses a pulse sequence for measuring the time characteristic of a flow in a vessel by means of the magnetic resonance. A time resolution of the flow is carded out instead of a spatial resolution in one direction. However, neither the evaluation nor the display is carded out during the measuring process, so that this technique as well does not allow parameter modification during the measuring process.

Due to the lack of intervention capability, the measuring sequence must be completely restarted multiple times until the desired measuring result is finally obtained.

SUMMARY OF THE INVENTION

An object of the present invention is to provide a method for flow visualization using magnetic resonance imaging which can be used to guide an intervention in real time.

The above object is achieved in accordance with the principles of the present invention in a method for quantification of an in vivo fluid flow wherein a magnetic resonance scan of an object area is conducted using a magnetic resonance pulse sequence to obtain magnetic resonance signals from the object area. These magnetic resonance signals including signals representing in vivo fluid flow flowing at a flow rate, and wherein the magnetic resonance signals are phase-encoded dependent on the flow rate using a magnetic field gradient, and wherein the magnetic resonance signals are evaluated in real time and the flow rate, represented by the phase-encoding, is converted into a real time graphic display, and wherein, using the real time graphic display, parameters of the pulse sequence can be altered during the scan.

The applicability of the inventive method becomes, in general terms, as simple as an ultrasound Doppler measurement due to the interactive adjustability of parameters during the measuring process. However, the MR measurement has the important advantage that the measured slice can freely be chosen whereas ultrasound imaging has significant restrictions. Further, the direction of the flow sensitivity can be adjusted freely and independently of the chosen slice in an MR measurement, whereas the direction of the flow sensitivity always coincides with the slice direction in an ultrasound Doppler measurement.

In one embodiment, the rate dependent phase is color coded so that an image impression arises that is comparable to that of a color Doppler image obtained by ultrasound.

DESCRIPTION OF THE DRAWINGS

FIGS. 1 through 4 illustrate an exemplary embodiment of a known pulse sequence for the acquisition of raw data obtained in an MR measurement suitable for use in the inventive method.

FIG. 5 shows an example of a picture screen illustration produced using the inventive method.

DESCRIPTION OF THE PREFERRED EMBODIMENTS

In general, each pulse sequence that provides information regarding the flow rate can be applied for acquiring the raw data. Since the information in real time is to be evaluated with sufficient time resolution and spatial, resolution, the measuring process, however, must be very rapid. The corresponding requirements have already been explained above. The EPI (Echo Planar Imaging) sequence is the most rapid pulse sequence, which is currently available and it is shown in conjunction with an excitation that is selective in two directions with a flow encoding in the FIGS. 1 through 4. The pulse sequence, according to the FIGS. 1, through 4, is known from German OS 44 46 423 and is explained in detail therein. This sequence includes an excitation phase A in which, as shown in FIG. 1, high frequency pulses RF are emitted under the effect of an operational sign that changes slice selection gradients $G_S$. As shown in FIG. 3, a gradient $G_P$ is respectively switched between the high frequency pulse RF in a direction that is perpendicular to the slice selection gradient $G_S$. An excitation that is selective in two dimensions is thus produced.

In a subsequent flow encoding phase F, a bipolar flow encoding gradient $G_F$ is switched in the direction of the following selection gradient $G_R$. Since the gradient-time-integral is zero over these bipolar gradients, stationary spins remain uninfluenced whereas moving spins, in known manner, are phase-encoded corresponding to their flow rate.

In a selection phase B, nuclear resonance signals are acquired under gradient pulses $G_R$, as shown in FIG. 2, in acquisition windows AQ according to the know EPI method.

By emitting short gradient pulses $G_P$, as shown in FIG. 3, between the individual acquisitions, the phase of the nuclear resonance signals switched from acquisition-to-acquisition in the direction of the gradient $G_P$. In a known manner, by this pulse sequence, nuclear resonance signals are obtained that exhibit a flow dependent phase in the direction of the flow encoding gradient $G_F$, whereby the following relation exists between the corresponding phase $\phi$ and the flow encoding gradient $G_F$:

$$\varphi(v,t) = \gamma \cdot \int_0^t G_F(t') \cdot v(t') \cdot dt'$$

By means of the integration time and the amplitude of the flow encoding gradient $G_F$, the magnitude of the flow sensitivity is determined and the direction of the flow sensitivity is determined by the direction of the flow encoding gradient $G_F$. For the determination of the above mentioned flow phase $\phi$ a reference phase is needed. This can be acquired by a re-phased flow measurement, for example. In order to avoid doubling the measuring time associated therewith, which is particularly problematic given real time measuring, a measurement can be conducted with alternating flow encoding corresponding to the suggestion based on the article in "Abstracts SMRM", Sydney 1998, page 2144, is mentioned above. The required reference phase is acquired by a static region in the viewing window or is acquired by averaging in an image sequence.

In the inventive method, however, the flow measurement, does not only ensue, as proposed in the mentioned SMRM abstract, in real time, i.e. but also it ensues with a sufficient time resolution, and it is also evaluated in real time. This means that the expansion, the image construction for example, with expansion of the rate dependent phase already ensues continuously during the measuring of the raw data and does not, in the conventional way, follow the raw data acquisition. Further, it is important that an interactive intervention possibility in the measuring process be provided. This presumes a control for the MR device wherein the sequence execution can still be influenced during the measurement, i.e. the sequence is not already completely determined before the start of the measurement. U.S. Pat. Nos. 5,144,242 or 5,606,258 disclose such control means, for example. A control means, as described in German OS 198 18 292, is particularly appropriate for the method for the flow quantification that is described herein, An example therefor is schematically shown in FIG. 5, of how the illustration on a monitor can ensue. The picture screen surface 1 is divided into a number of areas, with the anatomic image being shown in an area 2 in conjunction with flow information, a rate histogram is shown in an area 3 and different parameters are shown in a number of smaller areas 4. The flow information can be shown in the anatomic image, for example, by converting the measured flow phase into color-coded values, so that a viewer, similar to color Doppler measurement with ultra sound, can identify the flow rate from the color.

Interactively with the measurement, parameters of the measurement can be modified. By modification of the orientation and/or position of the measured slice, for example, the optimal diagnostic information can be obtained with respect to the flow. As explained above, the direction of the flow encoding gradient $G_F$ prescribes the direction in which the phase of the acquired signals are sensitive to the movement, or the flow. It has proven to be particularly advantageous when one can interactively adjust this direction with the measurement, when one places the flow sensitivity in the direction of the viewed vessel, for example. It is also expedient when one can adjust the sensitivity to the flow during the measurement. Corresponding to the current requirements, one can cover a large area of flow rates or one can arrive at a more or less fine resolution of the flow rate.

The above mentioned parameters are only examples for the interactive adjustability. Basically, all measuring parameters, such as the viewing field, repetition time, etc can be selected.

Even though, by changes in color, for example, information is presented in the image with respect to the time characteristic of the flow due to the real time measurement and real time evaluation, this information, however, is relatively difficult to evaluate. It is therefore advantageous to show a separate rate histogram in a window 3. To this end, a relevant region ROI that typically contains a particularly relevant blood vessel is initially delimited in the image illustration. The definition of this relevant region ROI graphically ensues by defining a rectangle with a mouse for example. From the relevant region ROI, the flow phase and the measuring time for each pixel are entered into a diagram and are shown in the window 3. In this diagram, the amplitude of each pixel is converted into a brightness value. A rate histogram thus is produced that clearly shows the rate distribution over time. By the conversion of the amplitude values into brightness values, one can visually differentiate the more significant signals of high amplitude from the signals of lesser amplitude.

It is therefore possible with the described method to achieve a flow illustration with a MR device, which is comparable to the conventional ultrasound Doppler measurement with respect to the examination process. However, several important disadvantages associated with ultrasound Doppler measurement are avoided. In Doppler ultrasound, for example, the available scanning planes are restricted. Moreover, the direction of the flow sensitivity is directly prescribed by the scanning plane and is not freely adjustable. This means that the rate components cannot be measured in arbitrary directions. In the MR measurement disclosed herein, not only the direction of the flow sensitivity but also the slice selection direction can be adjusted arbitrarily and independently of each other.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for quantification of an in vivo fluid flow comprising the steps of:

conducting a magnetic resonance scan of an object area using a magnetic resonance pulse sequence and thereby obtaining magnetic resonance signals from said object area, said magnetic resonance signals including signals representing in vivo fluid flow flowing at a flow rate in real time;

phase-encoding said magnetic resonance signals using a magnetic field gradient dependent on said flow rate;

evaluating said magnetic resonance signals in real time and converting said flow rate, represented by the phase-encoding, int a real time graphic display; and using said real time graphic display, altering parameters of said pulse sequence during said scan.

2. A method as claimed in claim 1 comprising converting said phase-encoding into a color-coding in said display in a spatially resolved illustration of the object area in said display.

3. A method as claimed in claim 1 comprising displaying sold phase-encoding along a time axis in said display as a histogram.

4. A method as claimed in claim 3 wherein said display includes a plurality of pixels and determining respective positions of the pixels in said display by time allocation and phase of said magnetic resonance signals, and allocating a brightness to each pixel dependent on an amplitude of the respective magnetic resonance signal.

5. A method as claimed in claim 4 comprising selecting a region of interest within said object area and displaying only information from said region of interest as a flow rate histogram.

6. A method as claimed in claim 1 wherein the step of adjusting parameters comprises positioning and orienting a measured slice of said object area during said scan.

7. A method as claimed In claim 1 wherein the step of adjusting parameters comprises adjusting a direction of said magnetic field gradient during said scan.

8. A method as claimed in claim 1 wherein said phase-encoding has a sensitivity associated therewith, and wherein the step of adjusting parameters comprises adjusting said sensitivity during said scan.

* * * * *